United States Patent
Daycock et al.

(10) Patent No.: US 8,563,435 B2
(45) Date of Patent: Oct. 22, 2013

(54) METHOD OF REDUCING DAMAGE TO AN ELECTRON BEAM INSPECTED SEMICONDUCTOR SUBSTRATE, AND METHODS OF INSPECTING A SEMICONDUCTOR SUBSTRATE

(75) Inventors: David A. Daycock, Boise, ID (US); Paul A. Morgan, Kuna, ID (US); Shawn D. Lyonsmith, Boise, ID (US); Curtis R. Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/615,155

(22) Filed: Sep. 13, 2012

(65) Prior Publication Data

US 2013/0011940 A1 Jan. 10, 2013

Related U.S. Application Data

(62) Division of application No. 11/525,492, filed on Sep. 21, 2006, now Pat. No. 8,334,209.

(51) Int. Cl.
*H01L 21/302* (2006.01)
*H01L 21/461* (2006.01)

(52) U.S. Cl.
USPC .................. 438/692; 438/14; 257/E21.521

(58) Field of Classification Search
USPC ............ 438/14, 692, 694, 758; 257/E21.521
See application file for complete search history.

(56) References Cited

U.S. PATENT DOCUMENTS

| | | | |
|---|---|---|---|
| 3,699,803 A | 10/1972 | Sumi | |
| 4,045,417 A | 8/1977 | Yamazaki | |
| 4,453,086 A | 6/1984 | Grobman et al. | |
| 5,830,785 A | 11/1998 | Sanson et al. | |
| 6,156,661 A | 12/2000 | Small et al. | |
| 6,372,657 B1* | 4/2002 | Hineman et al. | 438/723 |
| 6,878,213 B1 | 4/2005 | Rosato et al. | |
| 7,087,494 B2 | 8/2006 | Suzuki et al. | |
| 7,446,050 B2 | 11/2008 | Chang et al. | |
| 2003/0235994 A1* | 12/2003 | Pan et al. | 438/710 |
| 2004/0157450 A1 | 8/2004 | Bojkov et al. | |
| 2005/0032253 A1 | 2/2005 | Hsu et al. | |
| 2005/0032386 A1* | 2/2005 | Chang et al. | 438/712 |
| 2005/0109992 A1* | 5/2005 | Lee et al. | 252/510 |
| 2005/0260837 A1* | 11/2005 | Walther et al. | 438/513 |

OTHER PUBLICATIONS

Merriam Webster Online, www.merriam-webster.com/.../composition, pp. 1-2, May 9, 2010.
Olson et al., "Rinse Corrosion Prevention in Copper and Aluminum Back-End-of-the-Line (BEOL) Wet Clean Processes," Cleaning Technology in Semiconductor Device Manufacturing VI, The Electrochemical Society Proceedings Series, PV 99-36, p. 327 (2000) (8 pages).

(Continued)

*Primary Examiner* — Phuc Dang
(74) *Attorney, Agent, or Firm* — TraskBritt (57) ABSTRACT

Methods for reducing electron beam induced damage on semiconductor substrates employ compositions such as small chain organic solvents and non-neutral pH solutions to reduce or eliminate charge imbalances on semiconductor substrates caused by electron beam inspection of the semiconductor substrates. Damage to semiconductor substrates by electron beam inspection processes may also be reduced by generating or otherwise forming passivation films on a semiconductor substrate following electron beam inspection.

18 Claims, 9 Drawing Sheets

(56) References Cited

OTHER PUBLICATIONS

Rosato, et al., "Characterization of Metal Corrosion in BEOL Processes," Future Fab International, vol. 6, Jul. 1, 1998 (8 pages).

Matsui et al., "Evaluation of Damage Induced by Electron Beam Irradiation to MOS Gate Pattern and Method for Damage-Free Inspection," Metrology, Inspection, and Process Control for Microlithography XX, Proc. of SPIE vol. 6152, 61521S-1 (2006) (13 pages).

Jaubert et al., "Characterization of Charging Effect on 8" Wafer During E-Beam Lithography Exposure," Microelectronic Engineering, vol. 67-68 (2003) pp. 149-156.

Wang et al., "Plasma Induced Wafer Surface Voltage and Its Electrochemical Corrosion in Tungsten Plug Process," Sixth International Dielectrics for ULSI Multilevel Interconnection Conference (DUMIC) and Exhibition, Santa Clara, CA, Session VII VLSI Multilevel Interconnection Dielectric Reliability Issues, Feb. 28-29, 2000 (2 pages).

\* cited by examiner

METHOD OF REDUCING DAMAGE TO AN ELECTRON BEAM INSPECTED SEMICONDUCTOR SUBSTRATE, AND METHODS OF INSPECTING A SEMICONDUCTOR SUBSTRATE

CROSS-REFERENCE TO RELATED APPLICATION

This application is a divisional of U.S. patent application Ser. No. 11/525,492, filed Sep. 21, 2006, now U.S. Pat. No. 8,334,209, issued Dec. 18, 2012, the disclosure of which is hereby incorporated herein in its entirety by this reference.

BACKGROUND

1. Technical Field

Embodiments of the invention relate to methods for decreasing or eliminating electron beam damage to wafers in semiconductor fabrication processes and, more particularly, to methods for reducing electron beam damage to semiconductor wafers following W-CMP polishing of semiconductor wafers.

2. State of the Art

Critical dimensions of features on semiconductor wafers continue to shrink with advances in fabrication techniques. As the critical dimension sizes are decreased, defects associated with the fabrication processes increase. Although new fabrication processes are being developed to limit the formation of defects in semiconductor wafers during fabrication, defects still exist.

In a semiconductor wafer fabrication process, a semiconductor wafer undergoes many different fabrication process steps, including depositions, etching, polishing, rinsing, and the like. During these process steps, defects in the formation of the features of the semiconductor substrate may occur. Some defects in the semiconductor wafers result from corrosion. Corrosion may occur when semiconductor substrates are rinsed with an aqueous solution during the fabrication process. For example, semiconductor wafers having metallization features may undergo one or more rinsing processes wherein the semiconductor wafer is rinsed or washed in an aqueous solution. Contact between the aqueous solution and metals of the semiconductor wafer may result in the corrosion of the metal on the semiconductor wafer. Such corrosion may cause a defect in the semiconductor wafer.

Different forms of corrosion have been associated with semiconductor wafer fabrication. In some instances, the corrosion of semiconductor features may result from corrosion caused by the process chemistry. In other instances, corrosion may result from the rinsing of semiconductor wafers in de-ionized water, which is conventionally performed in semiconductor fabrication processes. For example, direct dissolution may occur where metal in the semiconductor substrate is directly dissolved by de-ionized (DI) water during a semiconductor substrate rinse process. Such corrosion, however, is rare in semiconductor substrates because the metals used in semiconductor processes are not typically prone to such dissolution. Concentration cell corrosion occurs where there is a substantial change in the pH of solutions contacting the semiconductor substrate. For example, concentration cell corrosion may occur when a semiconductor substrate is exposed to a solution having a high or low pH followed by exposure to a DI water rinse having a relatively neutral pH. Galvanic corrosion occurs when two different metals are simultaneously exposed to an electrolyte. Although pure DI water rinses are poor conductors of electrons, residual process chemicals carried into a DI water rinse bath on the surfaces of a semiconductor substrate may be sufficient to act as an electrolyte and promote corrosion between dissimilar metals on the semiconductor substrate. Process chemicals carried into a pure DI water rinse bath on the surfaces of a semiconductor substrate may also create an environment within which corrosion is promoted. For instance, process chemicals may react with DI water to promote the formation of hydroxyl ions ($OH^-$) that may then react with metals in the semiconductor substrate surfaces.

To help identify defects in semiconductor wafers, such as damage caused by corrosion, electron beam inspection instruments are used to inspect and review wafers throughout semiconductor fabrication processes. Electron beam inspection instruments, such as scanning electron microscopes and variations thereof, may be employed with semiconductor fabrication processes to inspect semiconductor wafers after particular fabrication processes. The electron beam inspection instruments use electron beams to create voltage contrasts between device structures to enhance or identify the conductivity of various portions of a semiconductor wafer. The identification of the conductive and less conductive portions of a semiconductor wafer helps to identify defects in the semiconductor wafer. For example, electron beam inspection instruments may be used to examine tungsten contacts on a semiconductor wafer after a tungsten chemical mechanical polishing step during semiconductor wafer fabrication. Tungsten metal fills openings, or vias, in the semiconductor wafer and connects with underlying structures. If a via is not sufficiently filled with tungsten or conductive metal, poor electrical continuity may result, indicating that errors in the fabrication of the semiconductor wafer may have occurred. The electron beam inspection instruments may be used to identify vias or contacts having insufficient tungsten deposition and insufficient conductivity, thereby identifying errors or defects in the semiconductor wafer.

Electron beam inspection instruments identify errors or defects in the semiconductor wafers by analyzing the surface electrons of the semiconductor wafers. The electron beam inspection instruments disrupt electrons on the surface of the semiconductor wafers, allowing detection or visualization of the surface being analyzed, such as by using voltage contrast measurements of the surface of the semiconductor wafers. In some instances, the electron beam inspection instruments extract, or pull, electrons from the surface of the semiconductor wafers, leaving the surface positively charged. In other instances, the electron beam inspection instruments implant electrons onto the surface of the semiconductor wafers, retarding the surfaces and leaving a negative charge on the surface of the semiconductor wafer.

While electron beam inspection instruments are employed to detect defects in semiconductor wafers, it has also been discovered that the irradiation of the semiconductor wafers by the electron beam inspection instruments may cause damage to semiconductor wafers. The damage to semiconductor wafers caused by the electron beam inspection instruments is undesirable.

Therefore, it would be desirable to develop methods for reducing corrosion on semiconductor wafers during fabrication processes. It is also desirable to reduce or eliminate damage to semiconductor wafers caused by electron beam inspection processes.

BRIEF DESCRIPTION OF THE DRAWINGS

While the specification concludes with claims particularly pointing out and distinctly claiming that which is regarded as the invention, this invention may be more readily understood and appreciated by one of ordinary skill in the art from the following description of the invention when read in conjunction with the accompanying drawings, in which:

DETAILED DESCRIPTION OF THE ILLUSTRATED EMBODIMENTS

As the feature sizes associated with semiconductor devices decrease, the need for inspection of semiconductor substrates during fabrication processes increases. In many instances, the diminishing feature sizes are dictating the use of more precise inspection methods and processes for inspecting semiconductor substrates, such as electron beam inspection processes. Damage to semiconductor substrates resulting directly from electron beam inspection of semiconductor substrates has been documented. However, it has now been discovered that electrical charge imbalances on semiconductor substrates resulting from electron beam inspection also facilitate corrosion of the semiconductor substrates in later processing steps, and particularly during semiconductor substrate rinse processes. According to particular embodiments of the invention, the corrosive damage to semiconductor substrates resulting from the charge imbalances caused by electron beam inspection of the semiconductor substrates may be reduced or eliminated by minimizing the charge imbalances on the surfaces of a semiconductor substrate.

Electron beam inspection of a semiconductor substrate causes an electron imbalance in the surface and subsurface of a semiconductor substrate. In some instances, the electron imbalance results in positively charged semiconductor substrate surfaces, and, in others, negatively charged semiconductor substrate surfaces. For example, electron beam inspection may involve the extraction of electrons from the surfaces of a semiconductor substrate, resulting in a positively charged surface on the semiconductor substrate. Metal contacts or surfaces on the semiconductor substrate subjected to such extraction of electrons are positively charged following electron beam inspection of the semiconductor substrate.

The immersion or exposure of the positively charged semiconductor substrate to de-ionized (DI) water may result in corrosion of the semiconductor substrate and particularly the positively charged metals that are part of such surfaces. The positively charged metals may react with hydroxyl ions formed in the DI water in accordance with Reaction 1:

$$M^{+n} + nH_2O \leftrightarrow M(OH)_n + nH^+ \qquad (1),$$

where M is a metal and n is the charge of the metal. The formation of metal oxides or metal hydroxides may result in the corrosion of the semiconductor substrate.

Electron beam inspection of a semiconductor substrate may also damage or remove protective oxide layers existing on a semiconductor substrate prior to electron beam inspection. The removal or damage to the protective oxide layers may expose metals on the semiconductor substrate that may be corroded by exposure to DI water, such as during a DI water rinse process.

Other forms of corrosion may also occur on the semiconductor substrate as a result of a positive or negative charge on the surfaces of the semiconductor substrate, or damaged or removed protective oxide layers on the semiconductor substrate, resulting from exposure of the semiconductor substrate to electron beam inspection.

Corrosion resulting from rinse processes or chemical processes following electron beam inspection of a semiconductor substrate is undesirable. As the feature sizes on semiconductor substrates decrease, methods and processes for reducing corrosion resulting from rinse processes or chemical processes following electron beam inspection of semiconductor substrates are desired.

According to particular embodiments of the invention, a charge imbalance on the surface of a semiconductor substrate caused by electron beam inspection of the semiconductor substrate may be reduced subsequent to the electron beam inspection. The reduction of the charge imbalance on the surface of the semiconductor substrate may reduce the formation of defects in the semiconductor substrate resulting from the electron beam inspection of the semiconductor substrate. For example, reduction of the charge imbalance on the surface of a semiconductor substrate following exposure to electron beam inspection may reduce corrosion of metal in the semiconductor substrate triggered by the charge imbalance when the semiconductor substrate is immersed in a DI water bath or other semiconductor substrate rinse process.

According to some embodiments of the invention, a charge imbalance on surfaces of a semiconductor substrate may be reduced or eliminated by contacting the semiconductor substrates with a liquid or gas capable of reducing or eliminating the charge imbalance. For example, a semiconductor substrate exposed to an electron beam inspection process may be contacted with a small chain organic solvent in liquid or gaseous form. In other embodiments, an electron beam inspected semiconductor substrate may be contacted with a non-neutral pH based solution in liquid or gaseous form to reduce or eliminate the charge imbalance on the semiconductor substrate surfaces.

Figure 1:
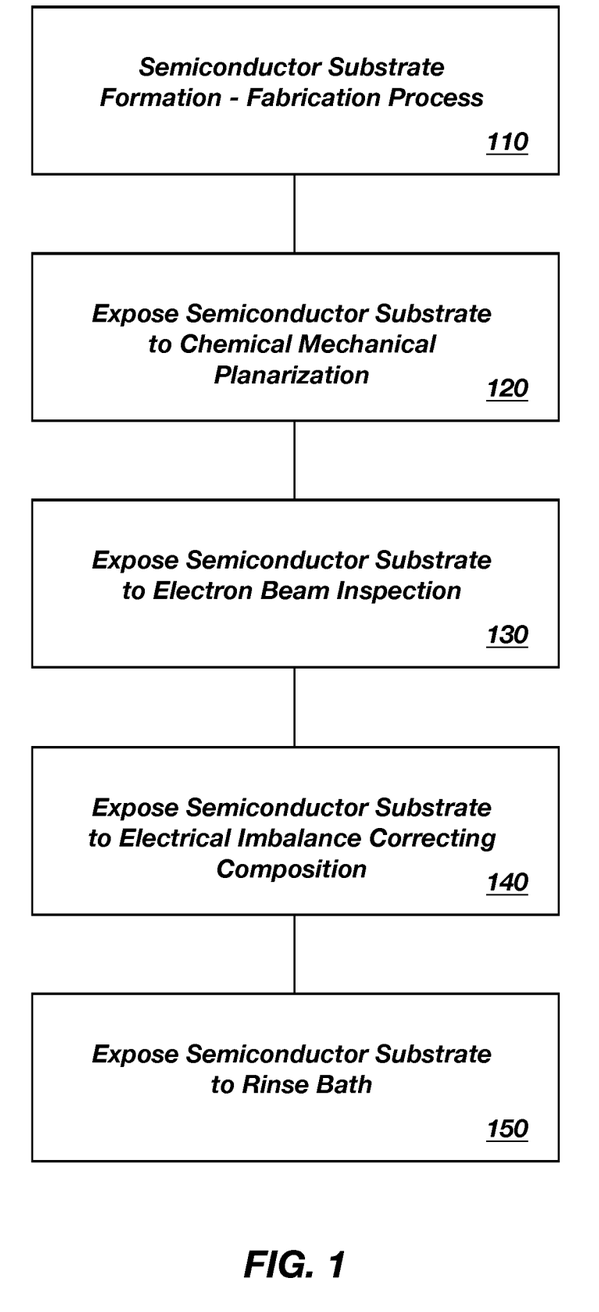
FIG. 1 illustrates a process for reducing defects in fabricated semiconductor substrates according to embodiments of the invention.

According to various embodiments of the invention, a process for reducing a charge imbalance in one or more surfaces of a semiconductor substrate may be performed following a process that causes the charge imbalance. For example, a process for reducing charge imbalances in the surfaces of a semiconductor substrate exposed to electron beam inspection following chemical-mechanical planarization (CMP) is illustrated in FIG. 1. A semiconductor substrate is formed in a semiconductor fabrication process 110. As part of the fabrication process, the semiconductor substrate may be exposed to a chemical-mechanical planarization 120. To ascertain the presence of defects on the semiconductor substrate, the semiconductor substrate is exposed to an electron beam inspection 130, which disrupts the electrical characteristics of the semiconductor substrate resulting in charge imbalances in the surfaces of the semiconductor substrate. The semiconductor substrate is then exposed to a charge imbalance correcting composition 140. The charge imbalance correcting composition may include a liquid or gaseous small chain organic solvent or a non-neutral pH based composition in liquid or gaseous form. The charge imbalance correcting composition acts on the semiconductor substrate, reducing charge imbalances in the semiconductor substrate caused by the exposure to electron beam inspection 130. The semiconductor substrate may then be exposed to a rinse bath 150.

The inclusion of the step of exposing the semiconductor substrate to a charge imbalance correcting composition 140 is unique to the semiconductor fabrication processes of embodiments of the invention and is not currently practiced with conventional semiconductor fabrication processes. The inclusion of such a step in a semiconductor fabrication process may reduce or eliminate charge imbalances in surfaces of a semiconductor substrate resulting in a reduction or elimination of corrosion in the surfaces of the semiconductor substrate during conventional rinsing processes.

In some embodiments of the invention, the exposure of a semiconductor substrate to a charge imbalance correcting composition 140 may include exposing the semiconductor substrate to a vapor composition comprising a small chain organic solvent. One such small chain organic solvent is 2-propanol, or isopropyl alcohol (IPA). In other embodiments, the small chain organic solvent vapor may include n-methylpyrrolidone (NMP). In still other embodiments of the invention, the small chain organic solvent vapor may include methanol.

Isopropyl alcohol is a chemical composition conventionally used with various semiconductor substrate fabrication processes and is therefore readily available in semiconductor fabrication processes. In some instances, IPA has been used as a rinse chemistry to remove chemicals or other pollutants from semiconductor substrates prior to exposure of such semiconductor substrates to a DI water rinse bath. In other instances, IPA has been used as a drying agent to dry semiconductor substrates exiting rinse baths. However, IPA has not been used in semiconductor fabrication processes to alter the charge state of semiconductor substrate surfaces prior to DI water rinse baths or as a rinse following exposure of a semiconductor substrate to electron beam inspection.

Similarly, n-methylpyrrolidone (NMP) is a chemical composition conventionally used with various semiconductor substrate fabrication processes, however, it has not been used in processes to reduce or eliminate charge imbalances in surfaces of semiconductor substrates. NMP is also readily available and may be easily incorporated into semiconductor substrate fabrication processes as a small chain organic solvent that may be used to reduce or eliminate charge imbalances in surfaces of semiconductor substrates.

In other embodiments of the invention, the exposure of a semiconductor substrate to a charge imbalance correcting composition 140 may include exposing the semiconductor substrate to a vapor composition comprising a non-neutral pH composition. The non-neutral pH composition may be selected to correct the charge imbalance in the surfaces of a semiconductor substrate. For example, if an electron beam inspection of a semiconductor substrate results in a net negative charge in the surfaces of the semiconductor substrate, a weak acid may be selected as the non-neutral pH composition. Weak acids have mobile hydrogen ions which, when contacted with the negatively charged surfaces of the semiconductor substrate, will neutralize the charge imbalance in the surface. The hydrogen ions may react with the negatively charged surface or with negatively charged species on the surfaces of the semiconductor substrate, such as hydroxyl ions, effectively canceling the charge imbalance in the surfaces of the semiconductor substrate or in negatively charged species on the semiconductor substrate.

Weak acids that may be used with various embodiments of the invention as a charge imbalance correcting composition include acids that do not fully ionize in solution. In addition, weak acids may include acids having low disassociation constants, such as, but not limited to, about 2.8 pKa to about 6.4 pKa. In addition, any weak acid or diluted acid capable of neutralizing negative charges on a semiconductor substrate may be used. For example, weak acids that may be used with embodiments of the invention may include, but are not limited to, compositions containing ethanoic acid, hydroxyacetic, methanoic acid, hydrogen carbonate, 2-hydroxy-1,2,3-propanetricarboxylic acid, butanoic acid, succinic acid, and mixtures thereof.

In those instances where electron beam inspection of a semiconductor substrate results in a net positive charge in the surfaces of the semiconductor substrate, or in other chemical species on the semiconductor substrate, a non-neutral pH composition capable of neutralizing the positive charge may be selected as a charge imbalance correcting composition. For example, a weak base may be applied to the semiconductor substrate to neutralize positive charges in the surfaces of the semiconductor substrate. Weak bases have an abundance of negatively charged hydroxyl ions that may react with the semiconductor substrate or otherwise neutralize the positive charge in the surfaces of the semiconductor substrate.

Weak bases that may be used with various embodiments of the invention as a charge imbalance correcting composition include any bases that do not fully ionize in an aqueous solution. Weak bases may also include bases or compositions containing a diluted base that are capable of neutralizing positive charges on a semiconductor substrate. In addition, weak bases may include bases having disassociation constants, such as, but not limited to, about 8.0 pKa to about 16.5 pKa. For instance, weak bases that may be used with embodiments of the invention may include, but are not limited to, compositions containing tromethamine, 2-amino-2-hydroxymethyl-1,3-propanediol, methylamine, trimethylamine, N-methyl-2-pyrrolidinone, and mixtures thereof.

Figure 2:
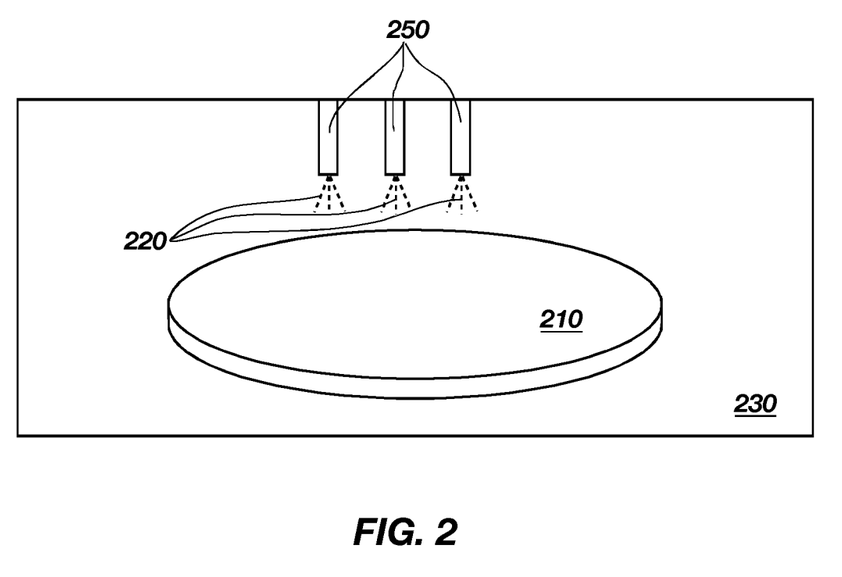
FIG. 2 illustrates a process for applying a vapor to a semiconductor substrate according to embodiments of the invention.

Methods for exposing semiconductor substrates to vapors are well known and any conventional method capable of distributing a selected charge imbalance correcting composition may be used to expose a semiconductor substrate to a charge imbalance correcting composition according to embodiments of the invention. For example, one process for exposing a charge imbalanced semiconductor substrate 210 to a gaseous charge imbalance correcting composition 220 is illustrated in FIG. 2. The charge imbalanced semiconductor substrate 210 may be positioned within a chamber 230. A vapor of a charge imbalance correcting composition 220, such as IPA, NMP, methanol, a weak acid, a weak base, or mixtures thereof, may be introduced into the chamber 230 via one or more vapor delivery nozzles 250 or other vapor conduits (not shown). Following exposure of the charge imbalanced semiconductor substrate 210 to the vapor of a charge imbalance correcting composition 220, the treated semiconductor substrate 210 may be removed from the chamber 230.

According to other embodiments of the invention, a charge imbalance on a semiconductor substrate may be reduced or eliminated by exposing the semiconductor substrate to a liquid charge imbalance correcting composition, such as a composition comprising a small chain organic solvent. As with the exposure of semiconductor substrates to gaseous, or vapor, forms of small chain organic solvents, semiconductor substrates having charge imbalances in surfaces thereof may be exposed to compositions including liquid IPA, NMP, or methanol to reduce or eliminate the charge imbalances in surfaces of the semiconductor substrates.

In other embodiments, semiconductor substrates having charge imbalances may be exposed to a liquid composition containing a weak base or a weak acid. Exposure of a positively charged surface of a semiconductor substrate to a weak base may neutralize the positive charge of the surface of the semiconductor substrate. Similarly, exposure of a negatively charged surface of a semiconductor substrate to a weak acid may neutralize the negative charge of the surface of the semiconductor substrate.

Figure 3:
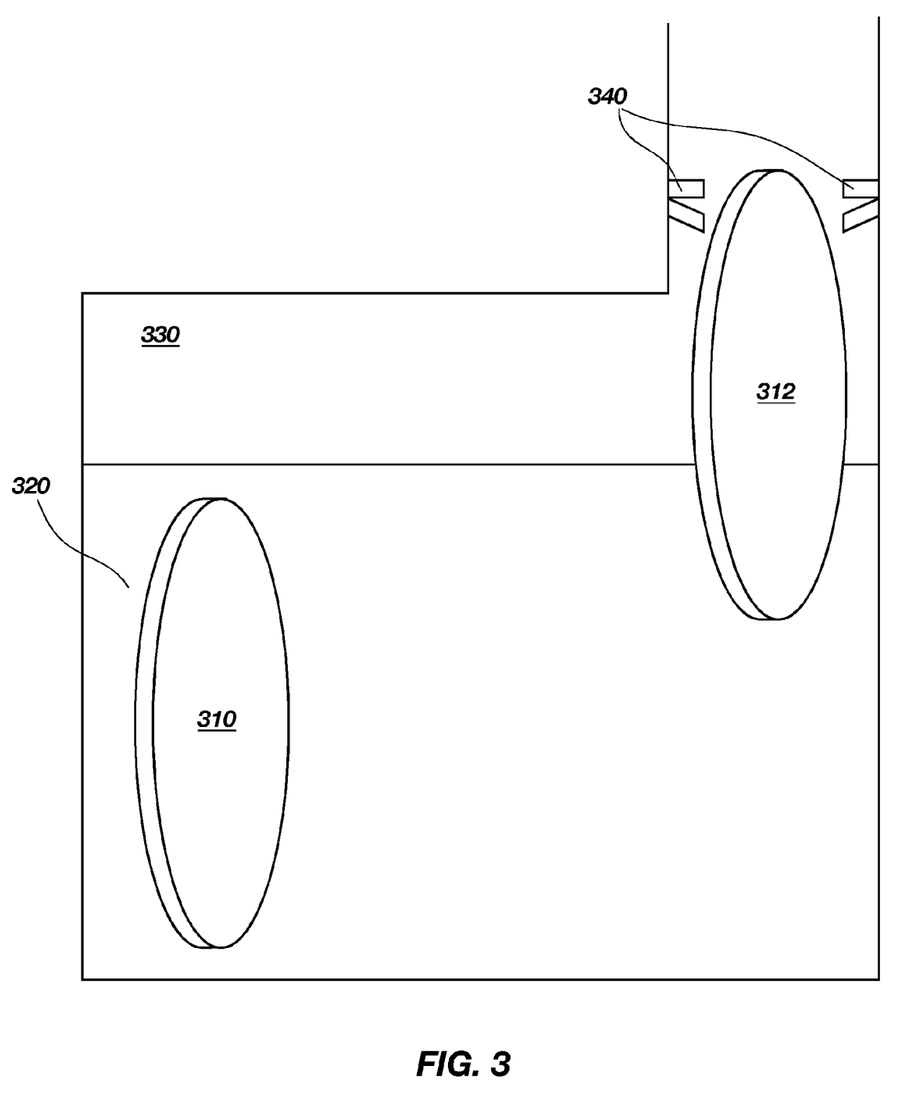
FIG. 3 illustrates a process for applying a liquid to a semiconductor substrate according to embodiments of the invention.

Liquid charge imbalance correcting compositions may be applied to an electrically imbalanced semiconductor substrate in any numbers of ways. For example, in some embodiments, a charge imbalanced semiconductor substrate may be rinsed in a liquid bath of a charge imbalance correcting composition as illustrated in FIG. 3. A charge imbalanced semiconductor substrate 310 may be submerged in a liquid charge imbalance correcting composition 320 in a washing tank 330, exposing the surfaces of the charge imbalanced semiconductor substrate 310 to the liquid charge imbalance correcting composition 320. Following submersion, the treated semiconductor substrate 312 may be removed from the liquid charge imbalance correcting composition 320. Dryers 340 may be used to dry off the treated semiconductor substrate 312 as it exits the washing tank 330 if desired. Dryers 340 may also be used to apply charge imbalance correcting compositions, such as IPA, to the surface of the treated semiconductor substrate 312.

In other embodiments, a liquid charge imbalance correcting composition such as small chain organic solvent, weak acid, weak base, or mixtures thereof, may be sprayed onto the semiconductor substrate, thereby applying the liquid to the surfaces of the semiconductor substrate.

Application of a liquid or gaseous charge imbalance correcting composition to a semiconductor substrate according to embodiments of the invention may also be performed using equipment and processes that are available in conventional semiconductor fabrication processes. For example, charge imbalance correcting compositions according to embodiments of the invention may be used with vapor jet drying processes, GreenDry processes, Marangoni drying processes, enhanced Marangoni drying processes, and surface tension gradient processes.

The treatment of an electron beam inspected semiconductor substrate with a liquid or vapor charge imbalance correcting composition containing IPA, NMP, methanol, one or more weak acids, one or more weak bases, or mixtures thereof, may reduce, eliminate, or neutralize electrical charges on the semiconductor substrate. The reduction in the positive or negative electrical charges in surfaces of the semiconductor substrate may reduce or eliminate corrosion resulting from the exposure of such surfaces to a rinse bath following electron beam inspection.

Figure 4:
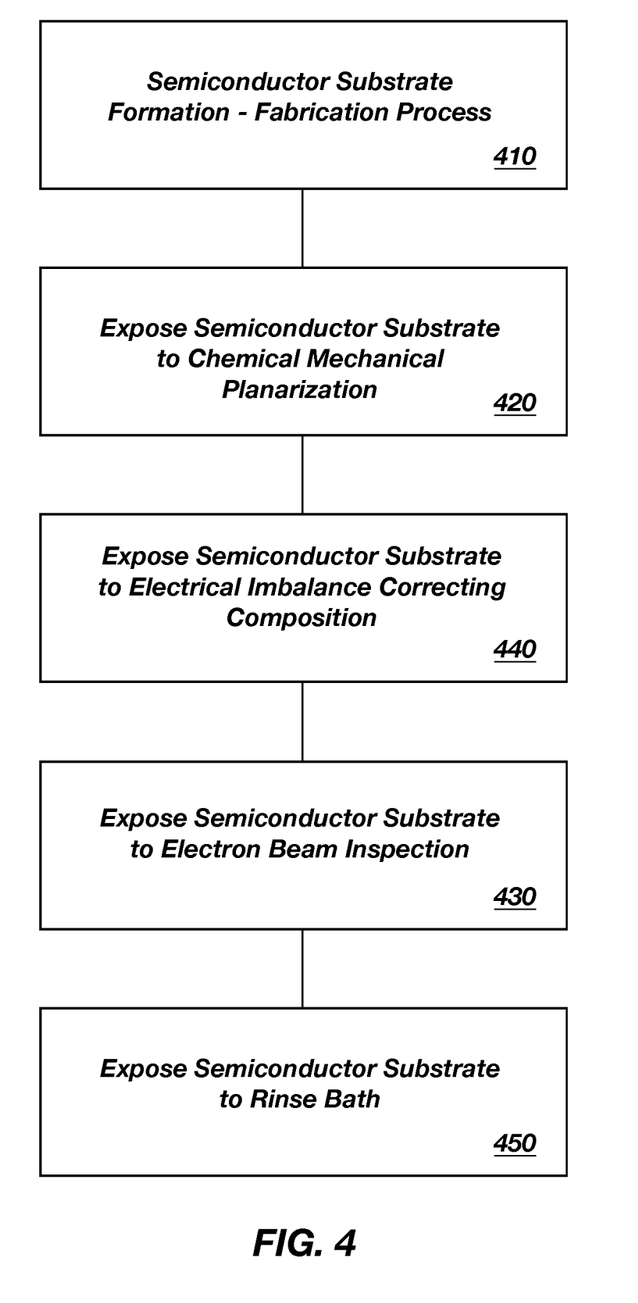
FIG. 4 illustrates a process for reducing defects in fabricated semiconductor substrates according to embodiments of the invention.

According to other embodiments of the invention, a semiconductor substrate may be treated prior to electron beam inspection of the semiconductor substrate to reduce charge imbalances on the surface and subsurfaces of the semiconductor substrate resulting from electron beam inspection of the semiconductor substrate. For example, a process for reducing charge imbalances in the surfaces of a semiconductor substrate exposed to electron beam inspection following chemical-mechanical planarization (CMP) is illustrated in FIG. 4. A semiconductor substrate is formed in a semiconductor fabrication process 410. As part of the fabrication process, the semiconductor substrate may be exposed to a chemical-mechanical planarization 420. The semiconductor substrate is then exposed to a charge imbalance correcting composition 440. The charge imbalance correcting composition may include a liquid or gaseous small chain organic solvent or a non-neutral pH based composition in liquid or gaseous form. The charge imbalance correcting composition acts on the semiconductor substrate, reducing charge imbalances in the semiconductor substrate. To ascertain the presence of defects on the semiconductor substrate, the semiconductor substrate is exposed to an electron beam inspection 430. The presence of the charge imbalance correcting composition on the semiconductor substrate may help to reduce the disruption of charges on the semiconductor substrate by the electron beam inspection. The semiconductor substrate may then be exposed to a rinse bath 450.

Exposure of the semiconductor substrate to a charge imbalance correcting composition 440 may include the exposure of the semiconductor substrate to a small chain organic solvent such as IPA, NMP, or methanol, or exposure of the semiconductor substrate to a non-neutral pH composition such as a weak acid or a weak base. Liquid or vapor charge imbalance correcting compositions may be applied to the semiconductor substrate using various methods, including those described with respect to other embodiments of the invention.

According to still other embodiments of the invention, corrosion of a semiconductor substrate following electron beam inspection may be reduced or eliminated by repairing, forming, or generating a protective oxide layer, nitride layer, or passivation layer over the semiconductor substrate following exposure to electron beams. The electron beam inspection of a semiconductor substrate may damage or remove protective layers on the semiconductor substrate, such as oxide layers. The formation or generation of one or more oxide layers, nitride layers, or passivation layers on the semiconductor substrate following such damage may protect features of the semiconductor substrate from corrosion during subsequent processing actions.

Figure 5:
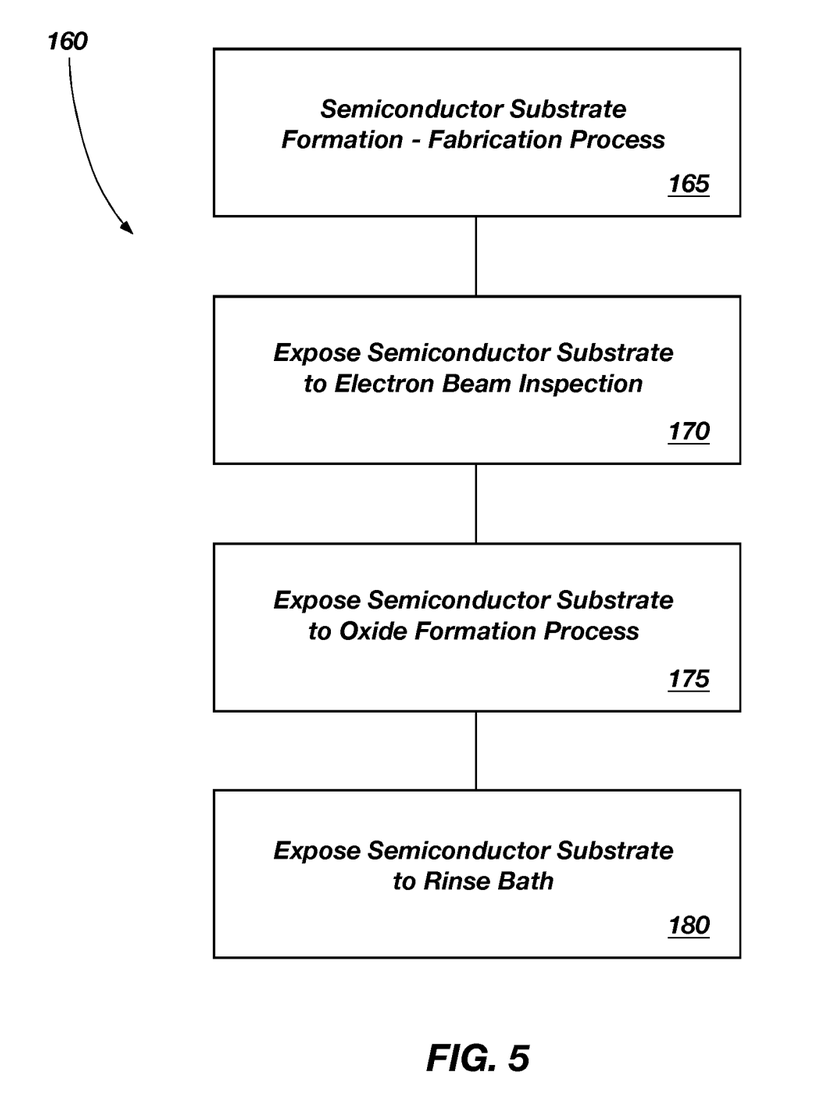
FIG. 5 illustrates a process for reducing defects in fabricated semiconductor substrates according to embodiments of the invention.

For example, a process 160 for forming an oxide layer on a semiconductor substrate following electron beam inspection is illustrated in FIG. 5. A semiconductor substrate is formed in a semiconductor fabrication process 165. To ascertain the presence of defects on the semiconductor substrate, the semiconductor substrate is exposed to an electron beam inspection 170. The electron beam inspection 170 disrupts oxides on the semiconductor substrate. The semiconductor substrate is then exposed to an oxide formation process 175, which forms, generates, or grows one or more oxide layers over one or more portions of the semiconductor substrate. The semiconductor substrate may then be exposed to a rinse bath 180.

Figure 6:
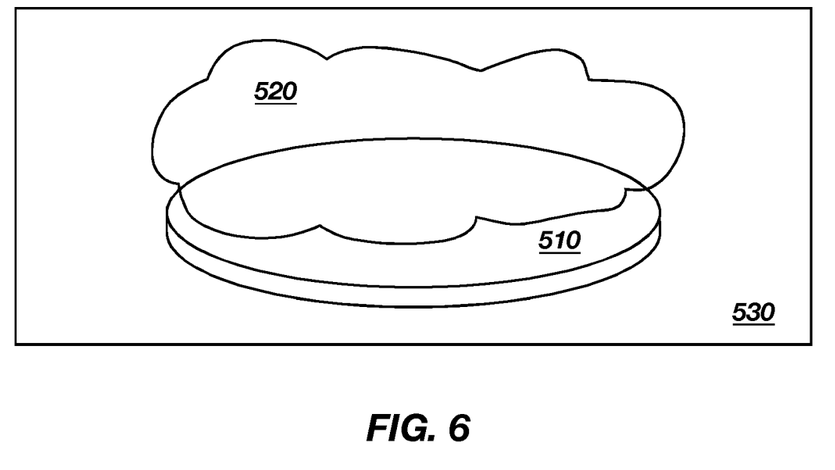
FIG. 6 illustrates a process for exposing a semiconductor substrate to a plasma according to embodiment of the invention.

The oxide layers created during the oxide formation process 175 may provide a protective layer over one or more portions of the semiconductor substrate such that the one or more oxide layers protect the semiconductor substrate from corrosion during subsequent rinse baths or other chemical processes. According to some embodiments of the invention, the oxide formation process 175 may include a plasma deposition process. The plasma deposition process may deposit, or otherwise generate, one or more oxide layers on a semiconductor substrate. For example, a semiconductor substrate 510 may be exposed to a plasma 520 within a plasma deposition chamber 530 as illustrated in FIG. 6. The plasma 520 may include any plasma configured to than or deposit one or more oxide layers on the semiconductor substrate 510. The deposition chamber may include any type of chamber configured to form a plasma that may be deposited, used to deposit, or used to assist in the generation of an oxide layer on a semiconductor substrate 510.

The oxide formation process 175 may also be substituted with a nitride formation process or a passivation layer formation process. In other embodiments, one or more oxide formation processes, nitride formation processes, or passivation layer formation processes may be used to form, generate, or grow one or more oxide layers, nitride layers, or passivation layers on the semiconductor substrate.

Formation of an oxide, nitride, or passivation layer on one or more surfaces of the semiconductor substrate 510 may be performed by exposing the semiconductor substrate 510 to a plasma including argon, nitrogen, oxygen, or a mixture thereof.

According to some embodiments of the invention, one or more oxide layers may be generated on a semiconductor substrate using any number of conventional methods for forming an oxide layer. In other embodiments of the invention, one or more nitride layers may be deposited on a semiconductor substrate using any number of conventional methods for forming a nitride layer. In still other embodiments of the invention, one or more passivation layers may be formed on a semiconductor substrate using any number of conventional methods for forming a passivation layer.

EXAMPLES

A group of fabricated semiconductor substrate wafers was exposed to electron beam inspection and various post-electron beam inspection treatments in an attempt to analyze the damage caused by electron beam inspection. Three semiconductor substrate wafers were subjected to electron beam inspection and various post-inspection treatments. A summary of the tests performed on the semiconductor substrate wafers is listed in Table 1.

TABLE 1

| Wafer # | Post eBeam Treatment | Post eBeam Clean | Results |
|---|---|---|---|
| 1 (23) | No | DI water | Damage to wafer |
| 2 (22) | Dry Strip | DI water | Clean |
| 3 (25) | Marangoni Dry | DI water | Clean |

All of the wafers identified in Table 1 were subjected to a tungsten chemical-mechanical planarization (CMP) prior to electron beam inspection of the wafer. Wafer 1 was processed according to conventional methods, which do not include a post-electron beam inspection treatment. Wafer 2 was subjected to a dry strip treatment following electron beam inspection to passivate any damage to Wafer 2 caused by the electron beam inspection. Both wafers 1 and 2 were subjected to a DI water nanospray rinse. Wafer 3 was subjected to a Marangoni dry instead of a post-electron beam inspection treatment and DI water rinse.

Figure 7A:
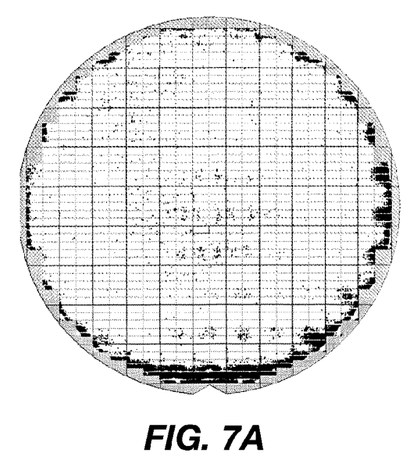
FIGS. 7A-7C illustrate computerized inspection representations of a semiconductor wafer during fabrication inspection processes.
Figure 7B:
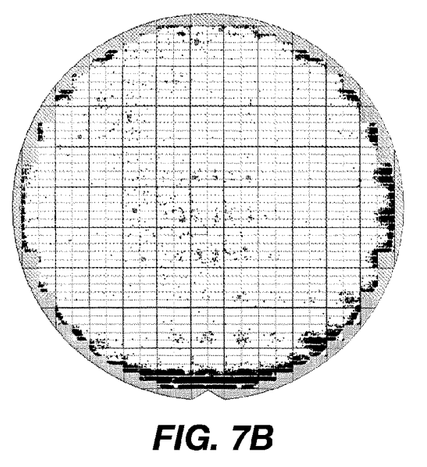

Wafer 1 was inspected for damage to the wafer prior to electron beam inspection. The results of the inspection are illustrated in FIG. 7A. Following electron beam inspection, a second inspection of Wafer 1 was performed. The results of the post-electron beam inspection damage inspection are illustrated in FIG. 7B. A third inspection of Wafer 1 was performed following the DI water nanospray rinse, which results are illustrated in FIG. 7C.

Figure 7C:
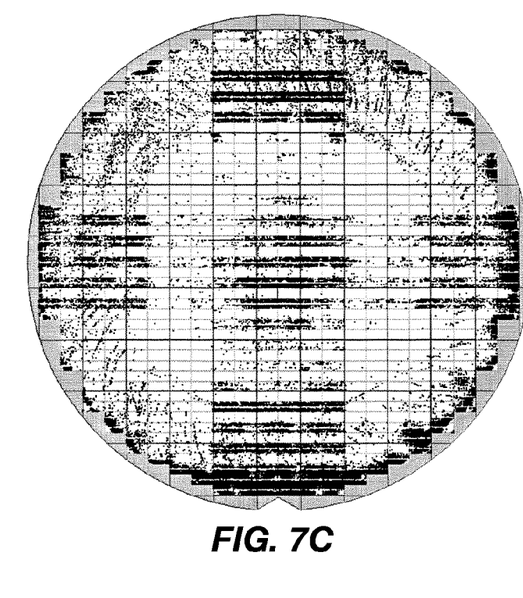

As illustrated by FIG. 7C, Wafer 1 showed signs of damage following the DI water nanospray rinse of wafer 1. The damage to wafer 1, illustrated by the dark regions or spots in FIG. 7C, follow the cross-hair pattern followed by the electron beam inspection apparatus. The striping pattern of damage on Wafer 1 following the DI water nanospray rinse indicates that the electron beam inspection of Wafer 1 instigated or otherwise assisted the formation of damage, such as corrosion, to Wafer 1 during the DI water nanospray rinse. Such damage is undesirable.

Figure 8A:
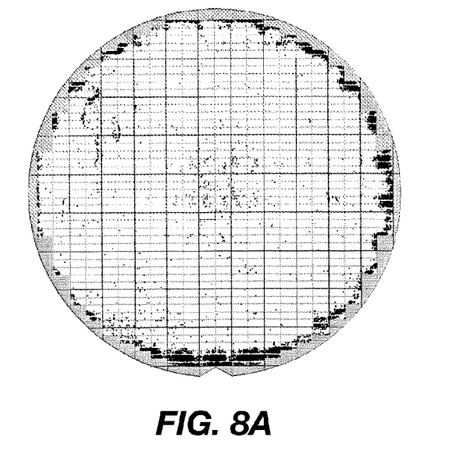
FIGS. 8A-8C illustrate computerized inspection representations of a semiconductor wafer during fabrication inspection processes.
Figure 8B:
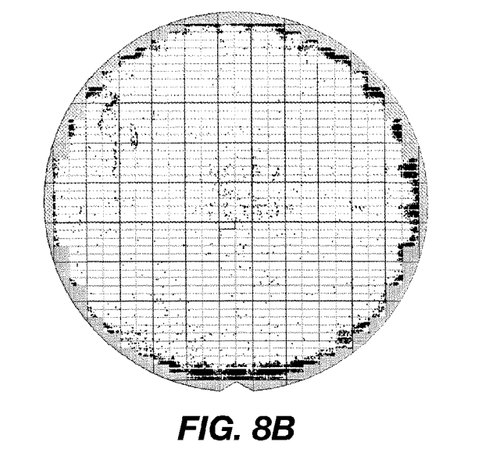
Figure 8C:
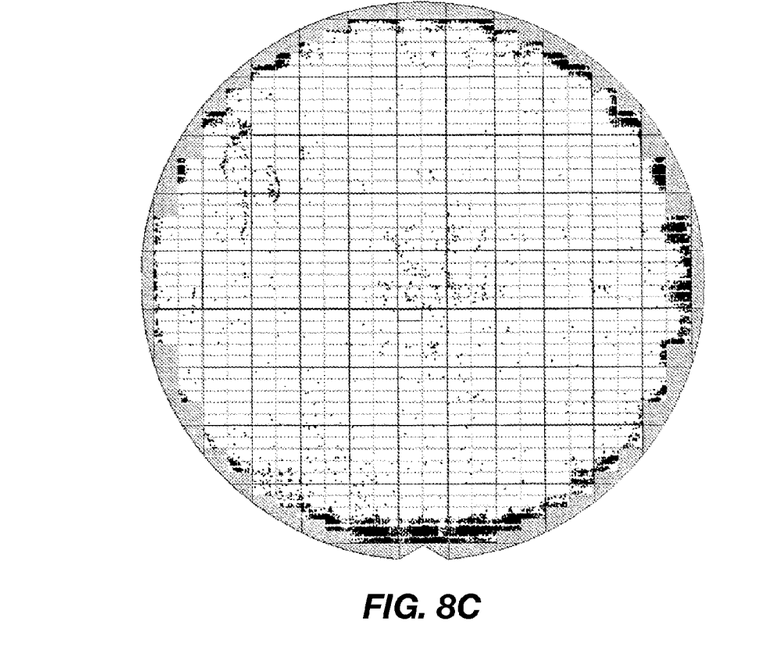

In an attempt to limit damage caused by the electron beam inspection of a wafer, Wafer 2 was subjected to a dry strip treatment following electron beam inspection. An inspection of Wafer 2 prior to being exposed to an electron beam inspection is illustrated in FIG. 8A. An inspection of Wafer 2 following electron beam inspection is illustrated in FIG. 8B. FIG. 8C illustrates the inspection results for Wafer 2 following the dry strip treatment and DI water nanospray rinse.

As illustrated by FIG. 8C, the dry strip treatment applied to Wafer 2 passivated the surface of wafer 2, decreasing damage to Wafer 2 caused by the DI water nanospray rinse. The DI water nanospray rinse applied to Wafer 2 did not cause damage to wafer 2, unlike wafer 1. A comparison of the effect of electron beam inspection on promoting damage to a wafer is evidenced by a comparison of FIGS. 7C and 8C. As illustrated by FIG. 8C, damage to an electron beam inspected wafer caused by a DI water nanospray rinse may be reduced by passivating the surface of the electron beam inspected wafer prior to subjecting the wafer to a DI water nanospray rinse.

Figure 9A:
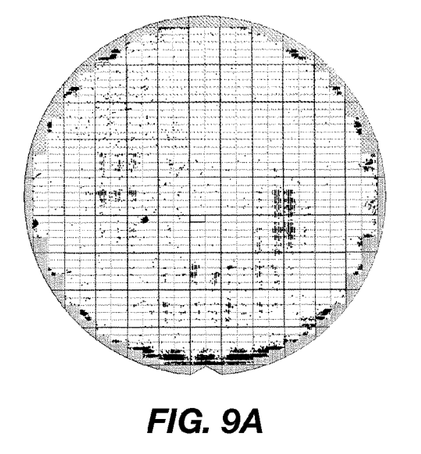
FIGS. 9A-9D illustrate computerized inspection representations of a semiconductor wafer during fabrication inspection processes.
Figure 9B:
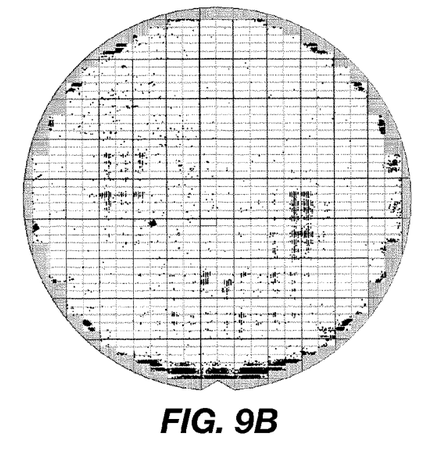
Figure 9C:
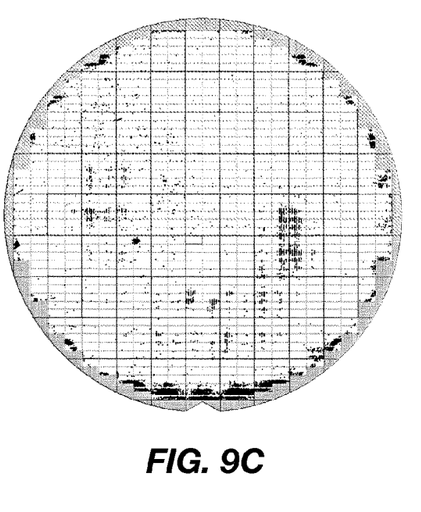

Wafer 3 was inspected prior to electron beam inspection and the inspection is illustrated in FIG. 9A. An inspection of Wafer 3 following electron beam inspection is illustrated in FIG. 9B. A Marangoni dry utilizing isopropyl alcohol was applied to Wafer 3 following electron beam inspection of the wafer. The results of an inspection of Wafer 3 following the Marangoni dry are illustrated in FIG. 9C. A DI water nanospray rinse was applied to wafer 3 following the Marangoni dry. The results of an inspection of Wafer 3 following the DI water nanospray rinse are illustrated in FIG. 9D.

Figure 9D:
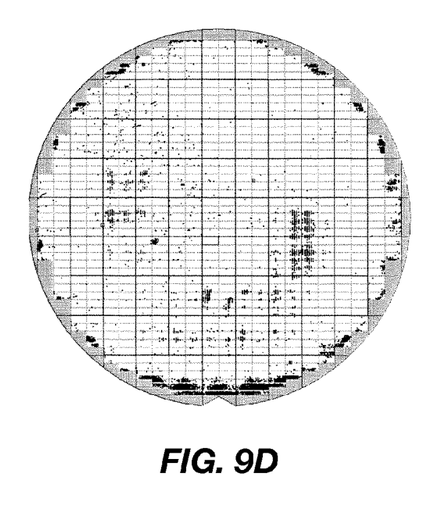

As illustrated in FIGS. 9A-9D, damage to Wafer 3 resulting from the DI water nanospray rinse following electron beam inspection was mitigated by the Marangoni dry. The Marangoni dry of Wafer 3 did not induce additional damage to Wafer 3 as illustrated in FIG. 9C. In addition, the DI water nanospray rinse of Wafer 3 did not promote damage to Wafer 3 in the same manner that Wafer 1 was damaged; this result is illustrated by the comparison of FIG. 9D with FIG. 7C. Thus, the application of a Marangoni dry process to Wafer 3 passivated the surface of Wafer 3 and mitigated additional corrosion or damage to the surface of wafer 3 following electron beam inspection.

The data and inspection results for wafers 1 through 3 indicate that damage promoted by the electron beam inspection of a wafer may be reduced or eliminated by treating the wafer, or passivating the surface of the wafer, prior to performing a DI water nanospray rinse or other chemical process on the wafer following electron beam inspection. Wafer 2 and wafer 3, treated according to embodiments of the invention, did not exhibit damage similar to the damage of Wafer 1 caused by the electron beam inspection of the wafers.

Having thus described certain currently preferred embodiments of the present invention, it is understood that the invention defined by the appended claims is not to be limited by particular details set forth in the above description, as many apparent variations thereof are contemplated without departing from the spirit or scope thereof as hereinafter claimed.

What is claimed is:

1. A method for reducing damage to an electron beam inspected semiconductor substrate, comprising:
   exposing the electron beam inspected semiconductor substrate to at least one plasma deposition process to form at least one of an oxide material, a nitride material, and a passivation material on the electron beam inspected semiconductor substrate; and
   exposing the electron beam inspected semiconductor substrate to deionized water after forming the at least one of the oxide material, the nitride material, and the passivation material thereon.

2. The method of claim 1, wherein exposing the electron beam inspected semiconductor substrate to at least one plasma deposition process comprises treating the electron beam inspected semiconductor substrate with an oxidizing plasma.

3. The method of claim 1, wherein exposing the electron beam inspected semiconductor substrate to at least one plasma deposition process comprises treating the electron beam inspected semiconductor substrate with a nitriding plasma.

4. The method of claim 1, wherein exposing the electron beam inspected semiconductor substrate to at least one plasma deposition process comprises treating the electron beam inspected semiconductor substrate with at least one plasma comprising at least one of argon, nitrogen, and oxygen.

5. The method of claim 4, wherein treating the electron beam inspected semiconductor substrate with at least one plasma comprising at least one of argon, nitrogen, and oxygen comprises treating the electron beam inspected semiconductor substrate with a plasma comprising a mixture of at least two of argon, nitrogen, and oxygen.

6. The method of claim 1, wherein exposing the electron beam inspected semiconductor substrate to at least one plasma deposition process comprises treating the electron beam inspected semiconductor substrate with at least one plasma configured to form the at least one of the passivation material, the oxide material, and the nitride material on the electron beam inspected semiconductor substrate.

7. The method of claim 6, wherein treating the electron beam inspected semiconductor substrate with at least one plasma comprises treating the electron beam inspected semiconductor substrate with multiple plasmas.

8. The method of claim 1, wherein exposing the electron beam inspected semiconductor substrate to at least one plasma deposition process comprises treating the electron beam inspected semiconductor substrate with at least one plasma configured to repair at least one of the passivation material, the oxide material, and the nitride material on the electron beam inspected semiconductor substrate.

9. The method of claim 1, wherein exposing the electron beam inspected semiconductor substrate to at least one plasma deposition process comprises treating the electron beam inspected semiconductor substrate with at least one plasma configured to form the passivation material on the electron beam inspected semiconductor substrate.

10. The method of claim 1, wherein exposing the electron beam inspected semiconductor substrate to at least one plasma deposition process comprises treating the electron beam inspected semiconductor substrate with at least one plasma configured to form the oxide material on the electron beam inspected semiconductor substrate.

11. The method of claim 1, wherein exposing the electron beam inspected semiconductor substrate to at least one plasma deposition process comprises treating the electron beam inspected semiconductor substrate with at least one plasma configured to form the nitride material on the electron beam inspected semiconductor substrate.

12. A method for inspecting a semiconductor substrate during fabrication, comprising:
    exposing a semiconductor substrate to an electron beam inspection process; and
    exposing the semiconductor substrate to a nitriding plasma configured to form a nitride material on the semiconductor substrate and treat an electrical charge imbalance formed on the semiconductor substrate by the electron beam inspection process.

13. The method of claim 12, further comprising performing an oxide formation process to form an oxide material over the semiconductor substrate.

14. The method of claim 12, wherein exposing the semiconductor substrate to a nitriding plasma comprises exposing the semiconductor to a plasma comprising nitrogen.

15. The method of claim 12, wherein exposing a semiconductor substrate to an electron beam inspection process comprises exposing oxides on the semiconductor substrate to the electron beam inspection process.

16. The method of claim 12, wherein exposing the semiconductor substrate to a nitriding plasma comprises exposing a portion of the semiconductor substrate to the nitriding plasma to form the nitride material on the exposed portion of the semiconductor substrate.

17. The method of claim 12, further comprising rinsing the semiconductor substrate after exposing the semiconductor substrate to the nitriding plasma.

18. A method for inspecting a semiconductor substrate, comprising:
    exposing a semiconductor substrate to an electron beam inspection process; and
    forming at least one of an oxide material, a nitride material, and a passivation material on the semiconductor substrate after exposing a semiconductor substrate to the electron beam inspection process to neutralize an electrical charge imbalance on the semiconductor substrate; and
    exposing the semiconductor substrate to deionized water after forming the at least one of the oxide material, the nitride material, and the passivation material on the semiconductor substrate.

* * * * *